(12) United States Patent
Paul et al.

(10) Patent No.: US 7,971,051 B2
(45) Date of Patent: Jun. 28, 2011

(54) FPGA CONFIGURATION PROTECTION AND CONTROL USING HARDWARE WATCHDOG TIMER

(75) Inventors: Steven Paul, Township of Washington, NJ (US); Arturo Garcia, Tappan, NY (US); Mark Capellaro, Danbury, CT (US)

(73) Assignee: Fujitsu Limited, Kawasaki (JP)

( * ) Notice: Subject to any disclaimer, the term of this patent is extended or adjusted under 35 U.S.C. 154(b) by 786 days.

(21) Appl. No.: 11/905,057

(22) Filed: Sep. 27, 2007

(65) Prior Publication Data
US 2009/0085603 A1    Apr. 2, 2009

(51) Int. Cl.
*G06F 9/00* (2006.01)
*G06F 17/50* (2006.01)
*H03K 19/173* (2006.01)
*H03K 19/177* (2006.01)
*G01R 31/28* (2006.01)

(52) U.S. Cl. .......... 713/100; 713/1; 326/38; 326/39; 714/725; 716/116

(58) Field of Classification Search .......... 713/1, 100; 326/38, 39; 714/725; 716/16, 116; 712/1, 712/100
See application file for complete search history.

(56) References Cited

U.S. PATENT DOCUMENTS

| | | | |
|---|---|---|---|
| 6,363,019 B1 * | 3/2002 | Erickson et al. | 365/189.07 |
| 6,463,339 B1 * | 10/2002 | Vasko | 700/18 |
| 6,651,188 B2 * | 11/2003 | Harding et al. | 714/38 |
| 6,748,457 B2 * | 6/2004 | Fallon et al. | 710/2 |
| 7,000,161 B1 * | 2/2006 | Allen et al. | 714/725 |
| 7,559,011 B1 * | 7/2009 | Edwards | 714/811 |
| 7,596,744 B1 * | 9/2009 | Kow et al. | 714/819 |
| 7,676,606 B1 * | 3/2010 | Edwards et al. | 710/15 |

* cited by examiner

*Primary Examiner* — Stefan Stoynov
(74) *Attorney, Agent, or Firm* — Murphy & King, P.C.

(57) ABSTRACT

An apparatus and method provides automatic reconfiguration of an FPGA, such as in case of lost configuration or configuration error, and software-controlled reconfiguration may be provided that does not require the use of additional devices. An apparatus for FPGA configuration protection comprises watchdog signal generator circuitry in the FPGA configured to output a watchdog signal when the FPGA is properly configured and watchdog circuitry configured to receive the watchdog signal and to initiate reconfiguration of the FPGA if the watchdog signal is not received for or within a predetermined time. The circuitry in the FPGA may be configured to receive a signal from a processor and to output the watchdog signal when the signal from the processor is received.

4 Claims, 3 Drawing Sheets

FPGA CONFIGURATION PROTECTION AND CONTROL USING HARDWARE WATCHDOG TIMER

BACKGROUND OF THE INVENTION

1. Field of the Invention

The present invention relates to a system and method by which automatic reconfiguration, such as in case of lost configuration or configuration error, and software-controlled reconfiguration may be provided.

2. Background of the Prior Art

A field programmable gate array (FPGA) is a semiconductor device containing programmable logic components and programmable interconnects. The programmable logic components can be programmed to duplicate the functionality of basic logic gates such as AND, OR, XOR, and NOT, or more complex combinational functions such as decoders or simple math functions. In most FPGAs, these programmable logic components (or logic blocks, in FPGA parlance) also include memory elements, which may be simple flip-flops or more complete blocks of memories.

A hierarchy of programmable interconnects allows the logic blocks of an FPGA to be interconnected as needed by the system designer. These logic blocks and interconnects can be configured by programming the FPGA after the manufacturing process by the customer/designer (hence the term "field programmable") so that the FPGA can perform whatever logical function is needed. EEPROM based FPGAs may only be programmed once, and thereafter do not need further programming. However, SRAM based FPGAs lose their configuration data when power is removed from the FPGA. These types of FPGAs must be reconfigured every time power is applied. The configuration data is typically stored in a non-volatile memory, such as an EEPROM or FLASH memory, and is loaded into the FPGA after power up. In many cases, this occurs automatically after the power supplies reach acceptable levels, thus, providing an instant-on solution similar to an ASIC.

A number of problems may arise with FPGAs that are configured in this manner. First, the initial configuration attempt may fail and the device may be left permanently in the unconfigured state. Second, the device may configure successfully only to lose configuration at a later time. Conventionally, the only solution to these problems is to add more intelligence to the board via a CPLD or processor to detect and recover from these error conditions. In itself, the processor provides a viable solution only if the FPGA being configured does not contain processor related glue logic. Otherwise, the processor would not have the supporting logic required to implement the configuration monitor function. If neither of these conventional approaches are utilized, a technician would be required to manually repair the board, such as by re-seating the board. In addition, under certain circumstances, software may wish to perform a race free reconfiguration of a non-volatile memory configured FPGA. An intelligent device, such as a processor, could perform this task, unless the FPGA contains glue logic that is needed in order for the processor to operate. Conventionally, reconfiguration of such a system was possible only if an extra device was added to the board, which provided the essential glue logic required to keep the processor up and running. Most board designs require some instant-on logic, such as glue logic. In addition, many board designs require a large FPGA that is under software control. Conventionally, the only way to provide such logic is by using additional non-programmable extra devices on the board.

Thus a need arises for a technique by which automatic reconfiguration, such as in case of lost configuration or configuration error, and software-controlled reconfiguration may be provided that does not require the use of additional devices.

SUMMARY OF THE INVENTION

The present invention provides a system and method by which automatic reconfiguration, such as in case of lost configuration or configuration error, and software-controlled reconfiguration may be provided that does not require the use of additional devices. With the present invention, automatic reconfiguration will occur (entirely in hardware) if configuration is lost for any reason. The glue logic may be absorbed into the EEPROM configured FPGA (saving board space) while still providing a software controlled reconfiguration path. The present invention also provides the capability for the instant-on logic and large FPGA(s) to be combined onto one device, which saves cost and board space.

An apparatus for FPGA configuration protection comprises watchdog signal generator circuitry in the FPGA configured to output a watchdog signal when the FPGA is properly configured and watchdog circuitry configured to receive the watchdog signal and to initiate reconfiguration of the FPGA if the watchdog signal is not received for or within a predetermined time. The watchdog circuitry is external to the FPGA. The watchdog circuitry comprises a timer. The circuitry in the FPGA is configured to receive a signal from a processor and to output the watchdog signal when the signal from the processor is received.

A method of FPGA configuration protection comprises initiating configuration of the FPGA, upon successful completion of configuration of the FPGA, outputting a signal from the FPGA, if the signal from the FPGA is received, not initiating reconfiguration of the FPGA, and if the signal from the FPGA is not received for or within a predetermined time, initiating reconfiguration of the FPGA. The method may further comprise receiving a signal from a processor and outputting the signal from the FPGA when the signal from the processor is received.

DETAILED DESCRIPTION OF THE PREFERRED EMBODIMENTS

The present invention provides a system and method by which automatic reconfiguration, such as in case of lost configuration or configuration error, and software-controlled reconfiguration may be provided that does not require the use of additional devices. With the present invention, automatic reconfiguration will occur (entirely in hardware) if configuration is lost for any reason. The glue logic may be absorbed into the EEPROM configured FPGA (saving board space) while still providing a software controlled reconfiguration path. The present invention also provides the capability for the instant-on logic and large FPGA(s) to be combined onto one device, which saves cost and board space.

Figure 1:
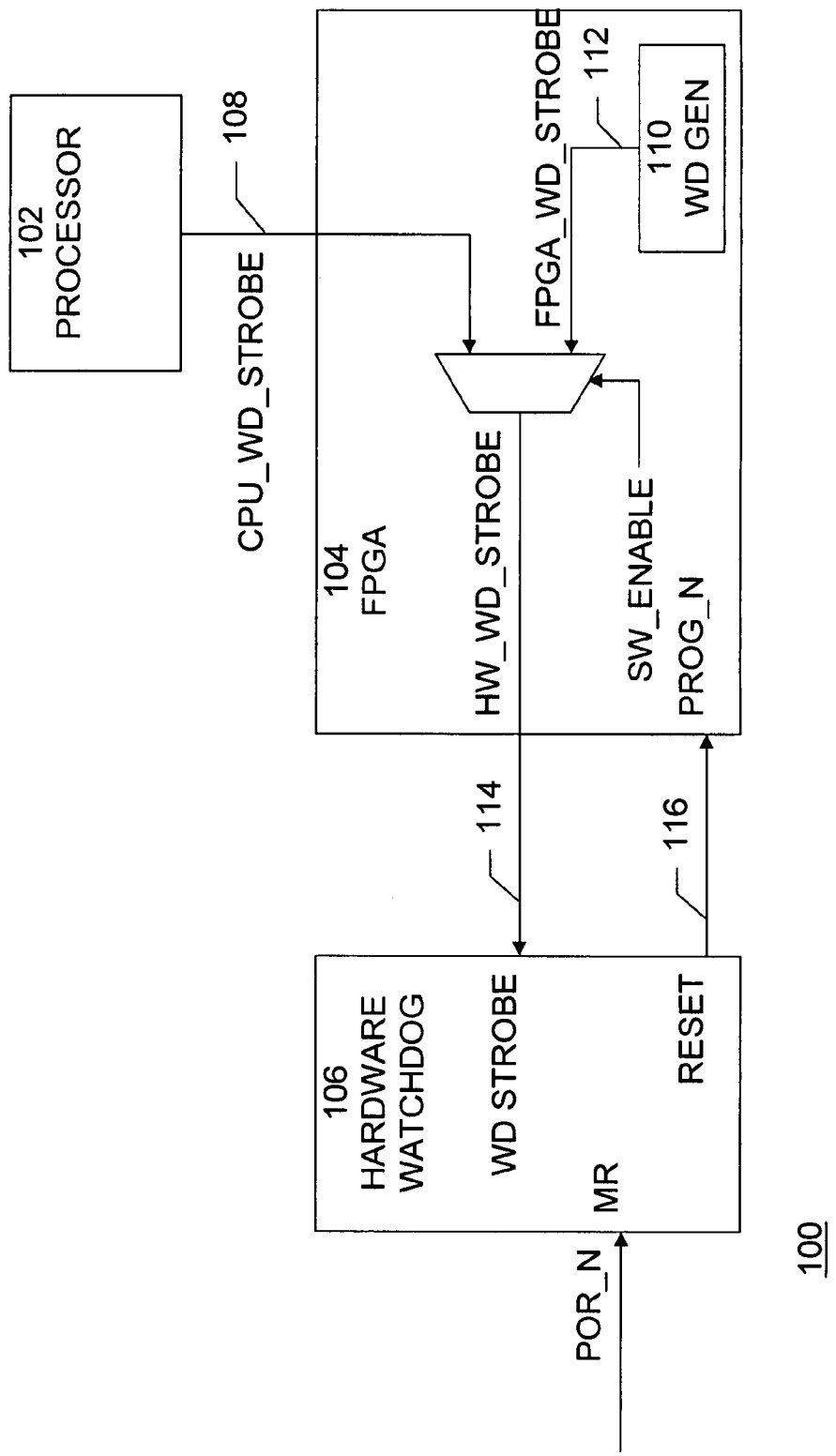
FIG. 1 is an exemplary block diagram of a system, in which the present invention may be implemented.

An exemplary block diagram of a system 100, in which the present invention may be implemented, is shown in FIG. 1. System 100 includes an optional processor 102, and FPGA 104, and a hardware watchdog device 106. Hardware watchdog device 106 provides protection against failed/lost configuration and optionally software controlled re-configuration. Processor 102 is not required for basic configuration monitoring. However, it may be used as part of a software reconfiguration path. It is typically a microprocessor or microcomputer, but may be any processing device implemented in any technology. During normal operation, after FPGA configuration and reset negation, processor 102 provides a signal, CPU watchdog strobe 108, which indicates that the processor is operating normally. CPU watchdog strobe 108 is generated periodically by software executing in processor 102 and indicates that the software running on processor 102 is executing normally. Although normal software execution in processor 102 may be interrupted due to problems with the software itself, it may also be intentionally interrupted to initiate FPGA reconfiguration. CPU watchdog strobe 108 is input to FPGA 104.

FPGA 104 includes watchdog generator circuitry 110, which generates a signal, FPGA watchdog strobe 112, which indicates that the FPGA is operating normally. For example, if the configuration of FPGA 104 fails, then watchdog generator circuit 110 will not be properly configured, and FPGA watchdog strobe 112 will not be generated. FPGA 104 also includes a multiplexer when coupled with a local processor. This mux transfers watchdog strobe responsibilities to the processor once it has been released from reset. This additional logic provides a clean software reconfiguration path while maintaining the basic configuration monitor function.

Figure 2:
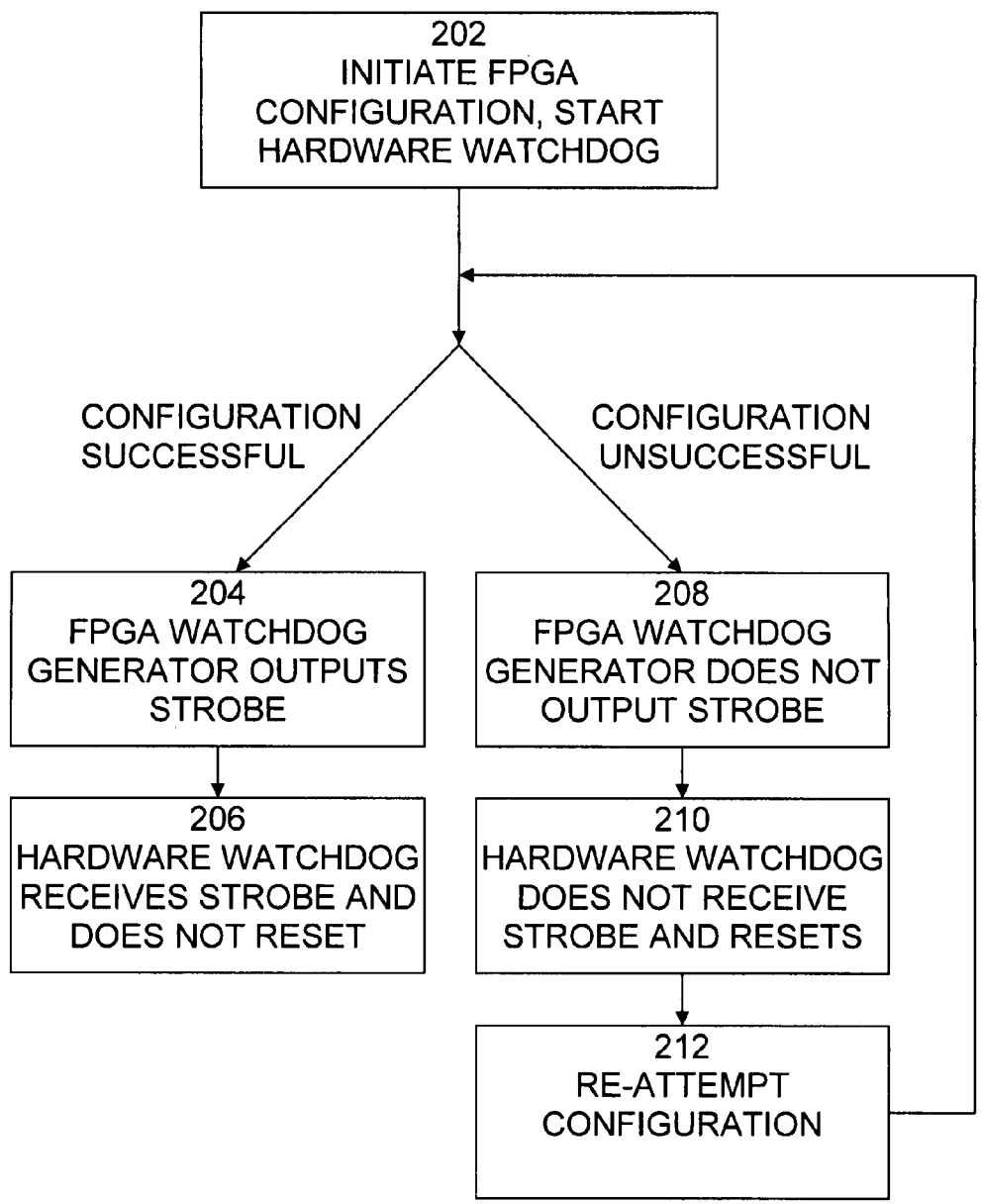
FIG. 2 is an exemplary flow diagram of a process or FPGA configuration protection.

A process 200 of operation of a FPGA configuration protection is shown in FIG. 2. It is best viewed in conjunction with FIG. 1. In step 202, configuration of FPGA 104 is initiated. Hardware watchdog device 106 includes a timer, such as a MAX6747®. When the FPGA configuration is initiated by a configuration signal (not shown), hardware watchdog device 106 starts counting. If the configuration is successful, the process continues with step 204, in which the FPGA watchdog generator 110 outputs FPGA watchdog strobe 112. Under normal circumstances, a typical FPGA 104 configures in less than 1 s and starts outputting FPGA watchdog strobe 112, which in turn causes hardware watchdog strobe 114 to be output to hardware watchdog device 106. In step 206, as long as hardware watchdog device 106 receives hardware watchdog strobe 114, it will not generate a reset signal 116, and FPGA 104 will retain its current configuration.

If the configuration is unsuccessful, then the process continues with step 208, in which the FPGA watchdog generator 110 will not generate FPGA watchdog strobe 112. An unsuccessful configuration means that FPGA watchdog generator 110 is not properly configured and so it will not generate its output signal, FPGA watchdog strobe 112. As a result FPGA 104 will not output hardware watchdog strobe 114 to hardware watchdog device 106. Eventually, in step 210, hardware watchdog device 106 will trip and output reset signal 116. In step 212, configuration will be re-attempted. This process will repeat until a successful configuration occurs.

Any loss of configuration of FPGA 104 will cause the FPGA's I/O to 3-state and strobing to stop. Hardware watchdog device 106 will trip and re-configuration will occur. If desired, software controlled re-configuration by processor 102 may be enabled. After configuration completes, FPGA 104 will continue to strobe hardware watchdog device 106 until processor 102 has been released from reset. Once this occurs, the responsibility of strobing hardware watchdog device 106 switches to processor 102. If at any time processor 102 wishes to re-configure the FPGA 104, the hardware watchdog device 106 is simply allowed to trip. If during normal operation the FPGA 104 loses configuration, the I/O will 3-state, the watchdog will trip and reconfiguration will occur.

Figure 3:
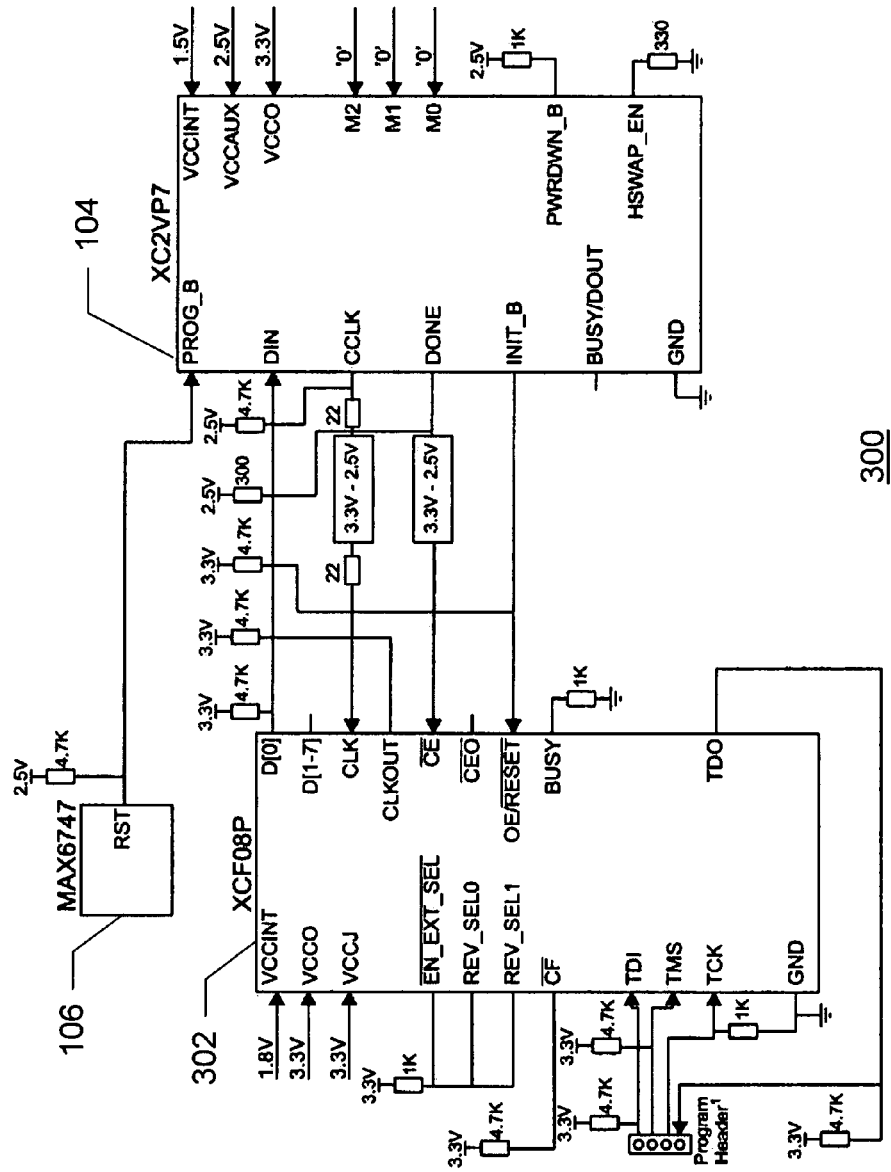
FIG. 3 is an exemplary block diagram of an implementation of a system in which the present invention may be implemented.

An example of an implementation of a system in which the present invention may be implemented is shown in FIG. 3. In this example, FPGA 104 is implemented using a XILINX® XC2VP7 VIRTEX-II Pro® FPGA, hardware watchdog device 106 is implemented using a MAXIM® MAX6747 microprocessor reset circuit, and the configuration memory device 302 for FPGA 104 is implemented using a XILINX® XCF08P programmable read-only memory (PROM). It is to be noted that this system and these components are merely examples of devices that may be used to implement the circuitry and functions of the present invention. The present invention contemplates application to any devices that implement the required circuitry and functions.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

The invention claimed is:

1. An apparatus for FPGA configuration protection comprising:
    watchdog signal generator circuitry in the FPGA configured to output a watchdog signal when the FPGA is properly configured;
    watchdog circuitry configured to receive the watchdog signal, to initiate reconfiguration of the FPGA with a reset signal if the watchdog signal is not received for or within a predetermined time, and to repeat until a successful configuration occurs;
    circuitry in the FPGA configured to receive a signal from a processor and to output the watchdog signal when the signal from the processor is received; and
    a multiplexer which transfers watchdog signal responsibilities to the processor after the processor is released from reset.

2. The apparatus of claim 1, wherein the watchdog circuitry is external to the FPGA.

3. The apparatus of claim 1, wherein the watchdog circuitry comprises a timer.

4. A method of FPGA configuration protection comprising:
    initiating configuration of the FPGA;
    upon successful completion of configuration of the FPGA, outputting a signal from the FPGA;
    if the signal from the FPGA is received, not initiating reconfiguration of the FPGA;
    if the signal from the FPGA is not received for or within a predetermined time, initiating automatic reconfiguration of the FPGA, repeating until a successful configuration occurs;
    receiving a signal from a processor;
    outputting the signal from the FPGA when the signal from the processor is received,
    outputting the signal from the FPGA after configuration of the FPGA is completed until the processor is released from reset;
    switching responsibility of outputting the signal to the processor; and
    initiating software-controlled reconfiguration of the FPGA when the processor wishes by allowing a watchdog device to trip.

* * * * *